United States Patent
Alsmeier et al.

(12) 
(10) Patent No.: US 6,518,145 B1
(45) Date of Patent: Feb. 11, 2003

(54) METHODS TO CONTROL THE THRESHOLD VOLTAGE OF A DEEP TRENCH CORNER DEVICE

(75) Inventors: Johann Alsmeier, Wappingers Falls, NY (US); George R. Goth, Poughkeepsie, NY (US); Max G. Levy, Essex Junction, VT (US); Victor R. Nastasi, Hopewell Junction, NY (US); James A. O'Neill, New City, NY (US); Paul C. Parries, Wappingers Falls, NY (US)

(73) Assignees: International Business Machines Corporation, Armonk, NY (US); Siemens Aktiengesellschaft, Munich (DE)

( * ) Notice: Subject to any disclaimer, the term of this patent is extended or adjusted under 35 U.S.C. 154(b) by 409 days.

(21) Appl. No.: 09/130,226

(22) Filed: Aug. 6, 1998

(51) Int. Cl.$^7$ ................................................. H01L 21/76
(52) U.S. Cl. .................... 438/425; 438/432; 438/435
(58) Field of Search ................................. 438/421, 424, 438/425, 432, 435

(56) References Cited

U.S. PATENT DOCUMENTS

| | | | |
|---|---|---|---|
| 4,666,556 A | * | 5/1987 | Fulton et al. ............... 438/424 |
| 4,923,821 A | | 5/1990 | Namose |
| 4,942,137 A | * | 7/1990 | Sivan et al. ................ 438/424 |
| 5,084,408 A | | 1/1992 | Baba et al. |
| 5,258,332 A | | 11/1993 | Horioka et al. |
| 5,296,392 A | | 3/1994 | Grula et al. |
| 5,321,289 A | | 6/1994 | Baba et al. |
| 5,387,540 A | | 2/1995 | Poon et al. |
| 5,436,488 A | | 7/1995 | Poon et al. |
| 5,468,982 A | | 11/1995 | Hshieh et al. |
| 5,521,422 A | | 5/1996 | Mandelman et al. |
| 5,567,553 A | | 10/1996 | Hsu et al. |
| 5,578,518 A | | 11/1996 | Koike et al. ............... 438/424 |
| 5,581,110 A | | 12/1996 | Razouk et al. |
| 5,712,185 A | * | 1/1998 | Tsai et al. .................. 438/424 |
| 5,837,612 A | * | 11/1998 | Ajuria et al. .............. 438/424 |
| 5,858,857 A | * | 1/1999 | Ho .............................. 438/424 |
| 5,880,004 A | * | 3/1999 | Ho .............................. 438/421 |
| 5,891,787 A | * | 4/1999 | Gardner ..................... 438/424 |

OTHER PUBLICATIONS

Patent application BU9–96–112XA, Ser. No. 08/753,234, filed Nov. 22, 1996, entitled: "Geometrical Control of Device Corner Threshold".

* cited by examiner

*Primary Examiner*—Olik Chaudhuri
*Assistant Examiner*—David S. Blum
(74) *Attorney, Agent, or Firm*—McGinn & Gibb, PLLC; Daryl K. Neff, Esq.

(57) ABSTRACT

A method of manufacturing a semiconductor trench device comprises forming a dielectric on a substrate, the dielectric having an underlying oxide layer adjacent the substrate, etching a trench in the dielectric and the substrate, forming a recess in the underlying oxide layer, filling the recess with a nitride plug, filling the trench a conductive material and oxidizing the dielectric and the conductive material, wherein the nitride plug controls a shape of a corner of the trench.

10 Claims, 8 Drawing Sheets

METHODS TO CONTROL THE THRESHOLD VOLTAGE OF A DEEP TRENCH CORNER DEVICE

BACKGROUND OF THE INVENTION

1. Field of the Invention

The present invention generally relates to methods for shaping the corners of deep trenches in a semiconductor transistor to increase the transistor's useful life.

1. Description of the Related Art

Figure 17:
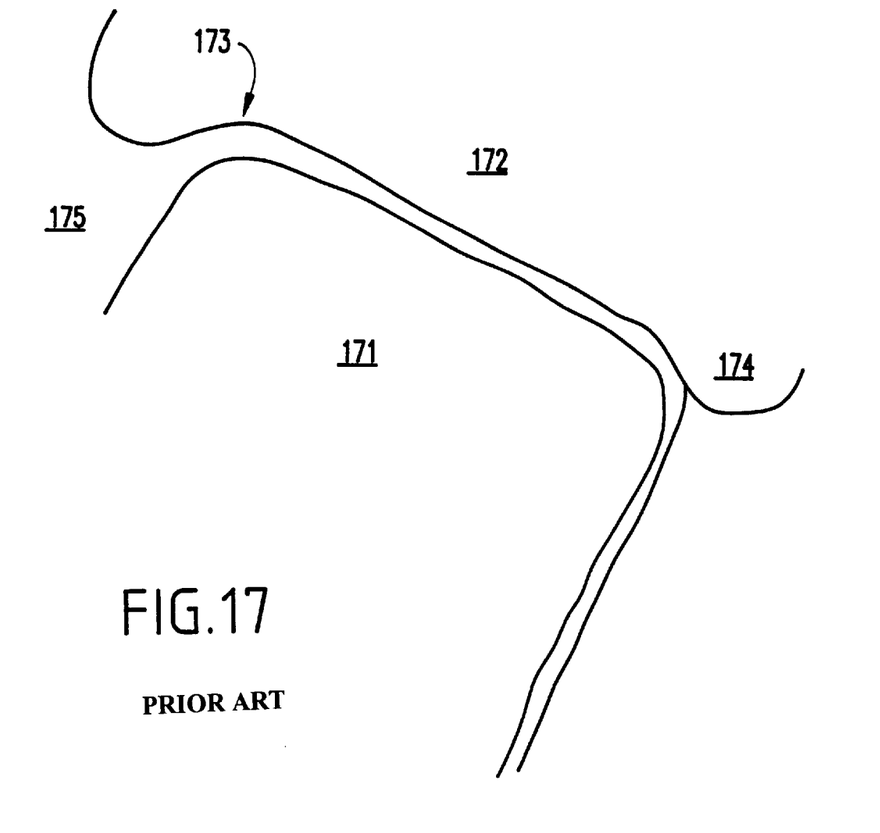
FIG. 17 is a schematic diagram of a cross-sectional view of a conventional trench corner shape.

Conventional technologies utilize metal oxide semiconductor field effect transistors ("MOSFET") bounded by deep and shallow trenches for storage nodes and device isolation, respectively. FIG. 17 illustrates a conventional deep trench bounded MOSFET device which includes polysilicon gates 172 which wrap around the edge of the device. These trenches conventionally include an abrupt corner 173 and a gate wraparound 174 at the edge of the active area, which cause the device to be characterized by one threshold voltage for the corner and another corresponding to the channel.

Ideally, the threshold voltage of the corner device should be equal to the threshold voltage of the channel Vt. In addition, abrupt geometry at the corner of a MOSFET leads to higher electric fields and higher Fowler-Nordheim tunneling current through the gate oxide at the corner than in the channel region.

Fowler-Nordheim tunneling current is due to the wave nature of an electron which allows it to "tunnel" from the valence band of the p-type semiconductor when it approaches the forbidden gap and appear at the same energy in the conduction band of the n-type semiconductor. The probability of this occurring is a strong function of the thickness of the barrier.

Such currents increase the risk of dielectric wearout at the deep trench corner 171 and deep trench/STI (shallow trench isolation region) intersection 173, 175. Control of the shape of the deep trench corner, then, is an important factor influencing both the corner voltage threshold Vt and the gate oxide wear at the edge of the device.

Figure 18:
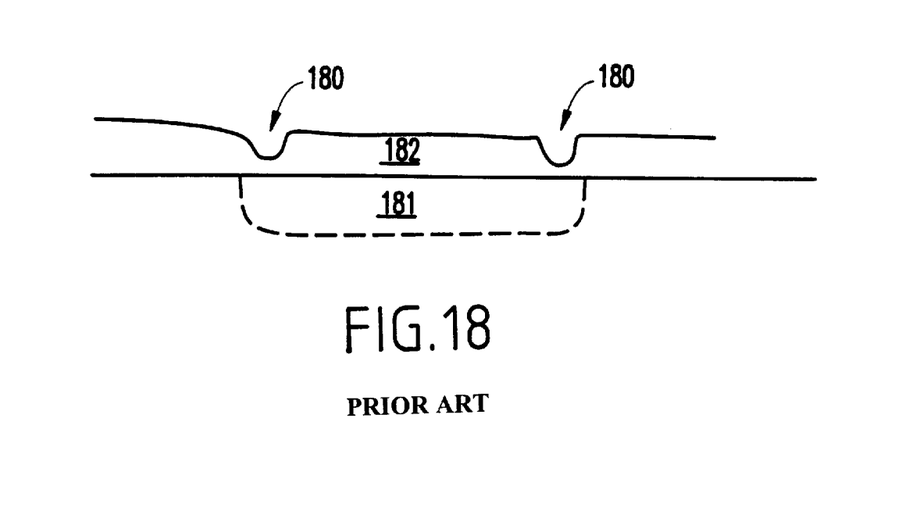
FIG. 18 is a schematic diagram of a cross-sectional view of a conventional trench corner shape.

The conventional structure is also shown as an equivalent planar device in FIG. 18 and includes corners 180, a channel 181 and an oxide 182 which has a thickness of approximately 100 Å. Due to field enhancement at the non-rounded deep trench corners, the effective thickness of the gate oxide is reduced at these points.

Figure 19:
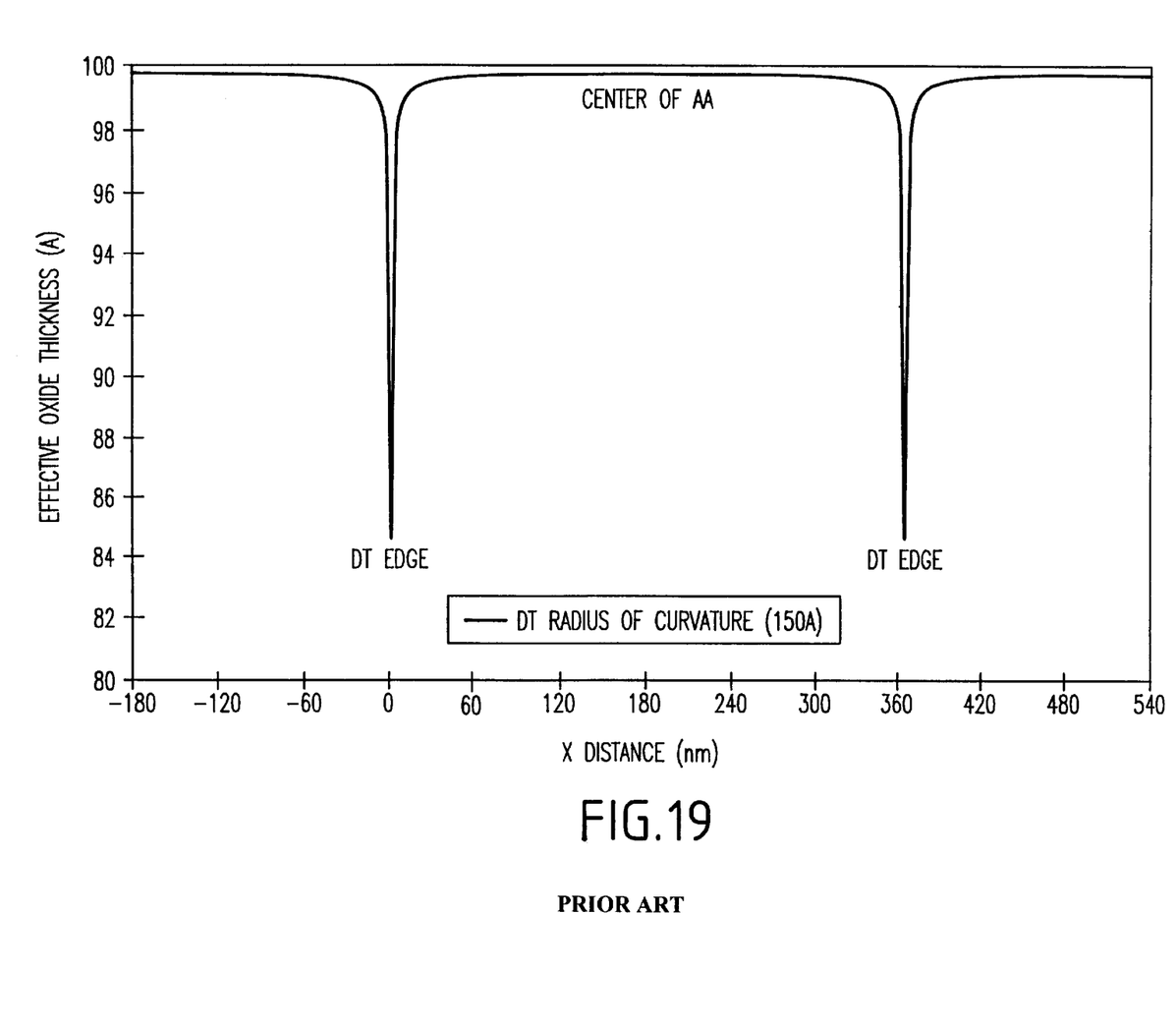
FIG. 19 is a chart showing the effective oxide thickness at different points along the trench.

The degree of effective oxide thinning at the corner is determined by the sharpness of the corner, a factor which can be quantified by the ratio of the radius of curvature of the corner relative to the thickness of the overlying gate oxide (R/Tox) at the corner. FIG. 19 illustrates the effective oxide thinning at the corner graphically. FIG. 19 was prepared assuming a deep trench corner having a radius of curvature 1.5× the thickness of the gate oxide and an infinite conducting plate separated from a conducting cylinder by a distance equal to the thickness of the gate oxide (e.g., 100 Å). The field enhancement illustrates the effective thickness of the gate oxide at the deep trench corner relative to that in the planar channel region of the device.

The enhanced field across the gate oxide at the deep trench corner decreases the corner Vt relative to the channel which contributes to a sub Vt leakage mechanism. This enhanced field will also degrade the reliability of the gate oxide at the corner. The electric field at the edge of the deep trench ultimately controls both the threshold voltage of the corner device and the reliability/wearout of the gate oxide. The ability to affect the shape (e.g., the radius of curvature) of the deep trench corner is critical in controlling these characteristics.

However, conventional processes cannot control the shape of the trench corner with precision. Therefore, the corners of the conventional trench devices will generally be very sharp, have a reduced oxide thickness, and exhibit reduced threshold voltage and excessive wear characteristics.

SUMMARY OF THE INVENTION

It is, therefore, an object of the present invention to provide a structure and method for increasing the threshold voltage of the corner device on a trench bounded metal oxide semiconductor field effect transistor (MOSFET) structure by controlling the shape of the corner. More specifically, the invention rounds the corners of the deep or shallow trenches which bound a MOSFET device. With the invention, the degree of field enhancement in regions of abrupt geometry (e.g., the corners) can be minimized and fine tuned.

A key advantage of the invention is that the amount of corner rounding is precisely controlled, which enables the corner device threshold voltage to be "tuned" to a desired value. For example, it would be preferable to increase the threshold voltage of the corner device to match the threshold voltage of the channel. As discussed in greater detail below, the invention uses wet etching to remove the oxide film under the pad nitride layer, thereby forming a recess which is subsequently filled with nitride from the node dielectric film. The resulting nitride plug controls the extent to which the trench corner is oxidized in subsequent processing steps.

The invention also controls the shape of the corner by controlling the stripping time of the passivation film so as to recess the pad the oxide film. By controlling the degree to which the pad oxide is recessed, the thickness of the pad oxide film and the amount of nitride remaining in the recess, the rounding of the trench corner can be controlled.

Thus, with the invention, the electric field enhancement and the threshold voltage at the corner of the device can be tuned to a desired value. The invention includes methods of shaping the edge of the deep trench in order to raise the corner threshold voltage to better match the channel threshold voltage Vt.

Several thermal oxidation steps determine the shape of the deep trench corner as well as the thickness of the gate oxide at the corner. These steps include the formation of the deep trench sacrificial oxide, the collar passivation oxide, the gate sacrificial oxides and the gate oxide. During the deep trench sacrificial oxide and collar preservation oxide processes, initial corner shaping occurs through the formation of a bird's beak under the pad films. While the final corner shape of the gate oxide thickness around this edge is determined by the gate sacrificial oxide and gate oxidation processes, the formation of a bird's beak during the deep trench related processes provides a sensitive means for controlling the ultimate shape of the deep trench corner.

The invention has the added benefit that it also controls the reliability of the gate oxide by influencing the Fowler-Nordheim tunneling current through the gate oxide at the edge of the device.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The invention includes multiple embodiments to shape the corner of the deep trench in order to control the corner threshold voltage and the leakage through the gate oxide. One embodiment uses a nitride plug to control the formation of the "bird's beak" under the pad stack films. A second embodiment controls the stripping of the passivation layer to control of the formation of the bird's beak and the corresponding undercutting of the pad oxide. By forming a bird's beak, the shape of the corner of the trench is controlled during the subsequent processing steps.

I. First Embodiment

Referring now to the drawings, and more particularly to FIGS. 1–9, a preferred embodiment of the invention is illustrated. The figures depict the process of forming a trench in a MOSFET device.

In practice, both deep and shallow trenches are used on actual devices as storage and isolation structures, respectively. For the purpose of illustration in this disclosure it is assumed that the trench is a deep trench storage node, and the figures refer to a preferred method for forming such a deep trench. However, the invention is not limited to a deep trench storage node and is equally applicable to other well known similar structures.

Figure 1:
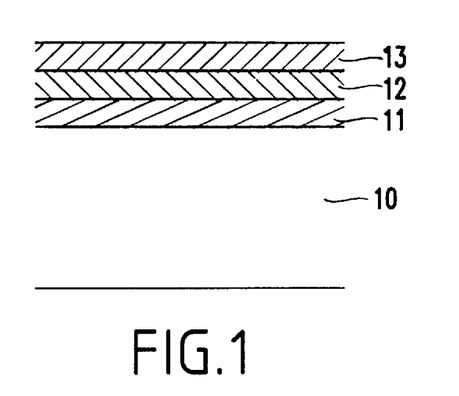
FIG. 1 is a schematic diagram of a cross-sectional view of a substrate illustrating a method of the invention.
Figure 2:
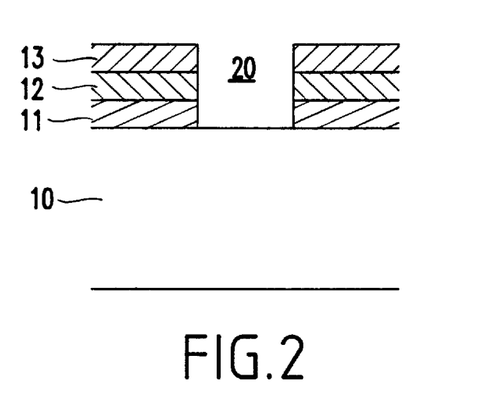
FIG. 2 is a schematic diagram of a cross-sectional view of a substrate illustrating a method of the invention.
Figure 3:
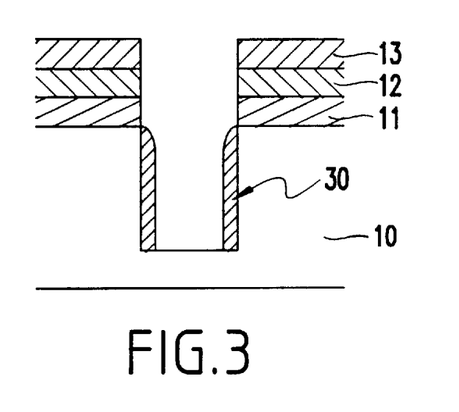
FIG. 3 is a schematic diagram of a cross-sectional view of a substrate illustrating a method of the invention.

More specifically, FIG. 1 illustrates a cross-sectional view of a silicon wafer 10 with a composite dielectric stack having an underlying oxide layer 11, a nitride film 12 and a top tetraethylorthosilicate ("TEOS") layer 13. Through well known photolithographic and reactive ion etching (RIE) processes, the pad dielectric films are patterned and subsequently etched leaving the structures illustrated in FIG. 2.

The patterned dielectric films serve as the masking layer for the anisotropic etching process used to form the deep trench 20 in the silicon wafer 10. The trench 20 is formed using anisotropic etching processes commonly known to those ordinarily skilled in the art. It is a characteristic of such a trench etching process that a passivating film 30, containing silicon dioxide and etch byproducts, is formed on the sidewall of the trench structure. This film 30, shown in FIG. 3, protects the trench sidewall from attack during the etching process and is responsible, in large part, for the resulting etch anisotropy.

After the etch is complete, this film is removed in a 40:1 buffered hydrofloric ("BHF") etching solution. This wet chemistry not only removes the passivating sidewall film, but it also etches silicon dioxide faster than silicon nitride in the pad stack films. In this manner, a recess 40, shown in FIG. 4, in the pad oxide film is formed under the pad nitride layer.

Figure 4:
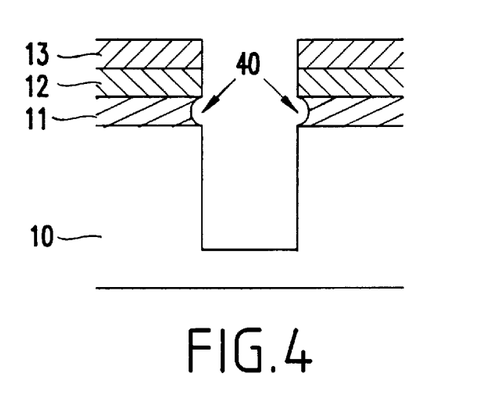
FIG. 4 is a schematic diagram of a cross-sectional view of a substrate illustrating a method of the invention.

The depth of this recess 40 is determined by the starting thickness of the pad oxide film 11 (typically 100 Å) as well as the duration of the etch process. As discussed in greater detail below with respect to the second embodiment, the stripping time of the passivation film can be varied to control the formation of the recess 40 with precision.

Figure 5:
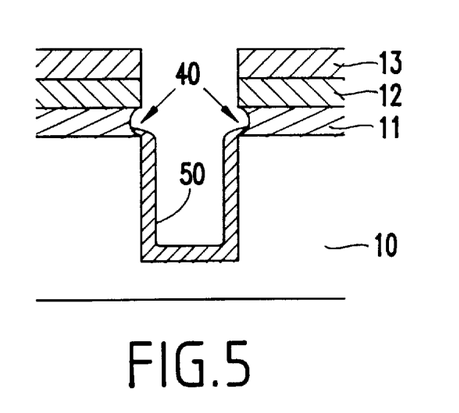
FIG. 5 is a schematic diagram of a cross-sectional view of a substrate illustrating a method of the invention.

After etching deep trenches in the silicon and stripping the etch byproduct layer from the sidewalls, RIE damage to the silicon crystal which forms the walls of the trench is removed by a thermal oxidation process and the resulting structure is shown in FIG. 5. The sacrificial oxide layer 50 formed during this process is then stripped using techniques well known to those ordinarily skilled in the art, and the trench 20 is ready for the formation of the capacitor dielectric layers.

Figure 6:
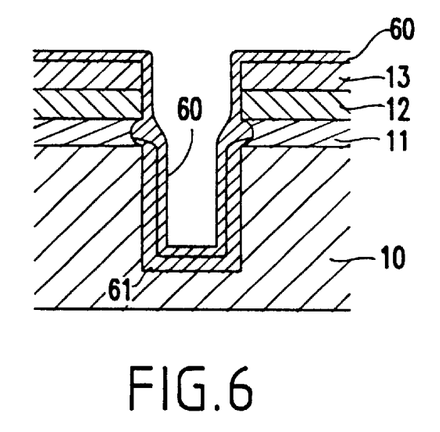
FIG. 6 is a schematic diagram of a cross-sectional view of a substrate illustrating a method of the invention.

FIG. 6 shows a cross-sectional view of the deep trench structure after deposition of the node nitride film 60. The node dielectric typically includes a bottom oxide layer 61 and an overlying nitride film 60 which may or may not be further oxidized. The bottom oxide layer 61 can be, for example, thermally grown silicon dioxide having a thickness in the range of 20 to 40 Å thick. The overlying nitride film 60 could be, for example, a liquid phase chemical vapor deposition (LPCVD) silicon nitride layer 50 to 80 Å thick. The nitride film 60 can fill the undercut region 40 of the pad oxide film 11, depending on the relative thickness of the node nitride 60 and the pad oxide films 11.

Figure 7:
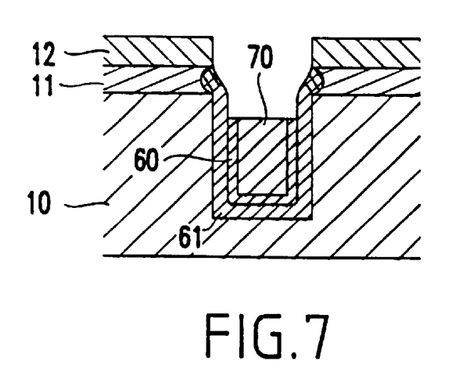
FIG. 7 is a schematic diagram of a cross-sectional view of a substrate illustrating a method of the invention.

After the node dielectric 60, 61 is formed, the trench is filled with doped polysilicon 70, as shown in FIG. 7, which forms one electrode of the storage capacitor (the other electrode is the silicon substrate 10). The silicon 70 is then recessed and the dielectric layer 60, 61 in the recess above the level of the silicon, is stripped in preparation for the formation of an insulating collar oxide layer 80, shown in FIG. 8.

Figure 8:
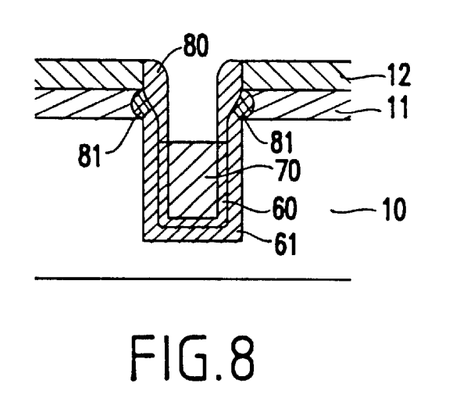
FIG. 8 is a schematic diagram of a cross-sectional view of a substrate illustrating a method of the invention.

FIG. 8 depicts a cross-sectional view of the trench structure after the formation of the collar dielectric 80. The trench collar 80 isolates the charge stored in the node from the diffused junctions which abut the trench and prevents parasitic leakage in this region. As a consequence of the dielectric stripping process, a "plug" of nitride 81 is intentionally left in the undercut region 40 of the pad oxide 11.

The amount of plug material 81 which remains is controlled by the thickness of the node nitride 61 and pad oxide films 11, as well as the duration of the node dielectric strip process. Since silicon nitride is an effective oxidation barrier, the presence of this plug 81 controls the oxidation of the trench corner and thereby fine tunes the degree of corner rounding which occurs in subsequent oxidation processes. The nitride plug 81 which remains in the pad oxide undercut 40 prevents further oxidation and therefore modifies the corner shape.

Figure 9:
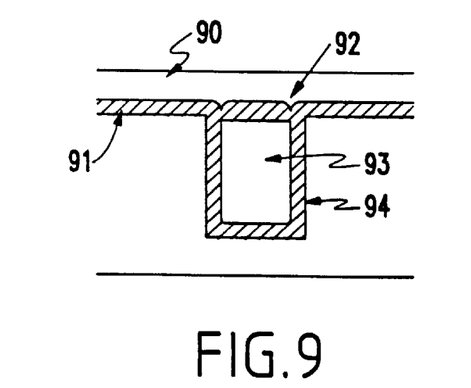
FIG. 9 is a schematic diagram of a cross-sectional view of a substrate illustrating a method of the invention.

FIG. 9 illustrates a trench-bounded MOSFET device which has completed processing through the formation of the gate conductor film 90 and includes a node conductor 93 and a node dielectric 94. The gate oxide film is formed by a furnace oxidation followed by an in situ doped polysilicon gate conductor deposition. The gate conductor 90 runs across the gate oxide film 91 and over the deep trench structure.

In the region where the gate conductor passes over the trench corner, the gate conductor wraps around the corner due to the presence of the divot 92 in the trench-top oxide. Due to this corner geometry and the gate wraparound, the electric field across the gate dielectric is enhanced in this region. Such field enhancement leads to a threshold voltage for the corner device which is lower than that for the planar region (e.g., the channel) of the MOSFET.

Figure 10:
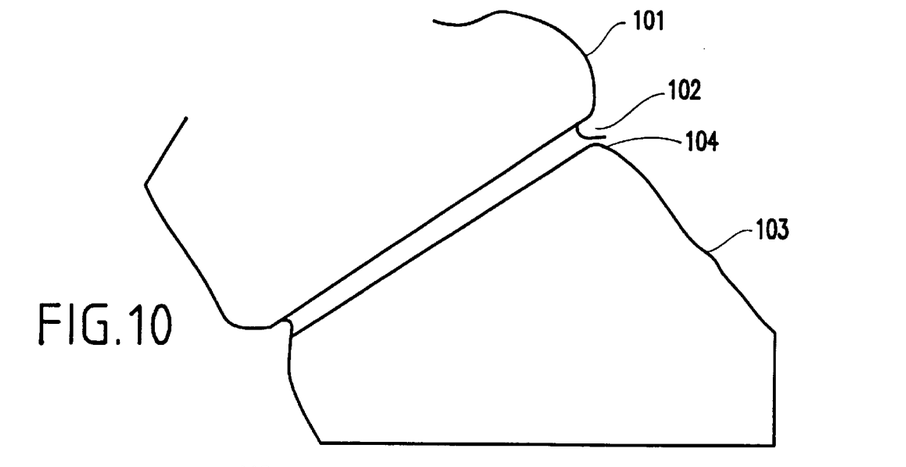
FIG. 10 is a schematic diagram of a cross-sectional view of a substrate illustrating a method of the invention.
Figure 11:
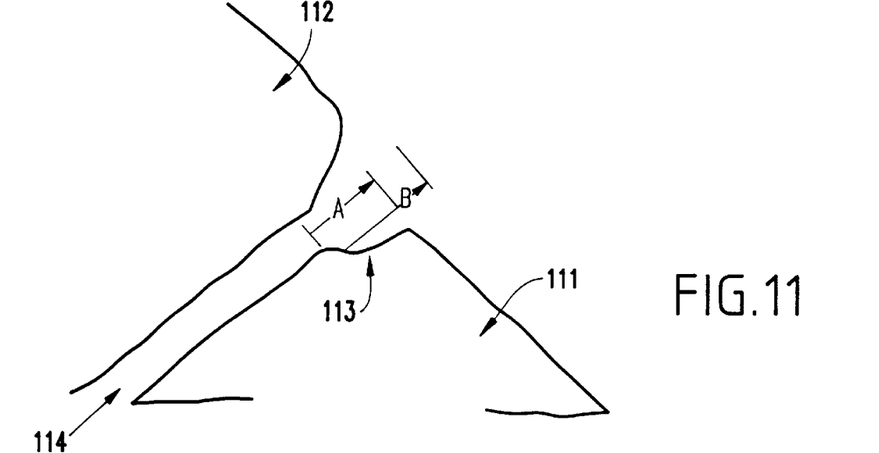
FIG. 11 is a schematic diagram of a cross-sectional view of a substrate illustrating a method of the invention.

FIGS. 10 and 11 illustrate the effect that the nitride plug has on the shape of the trench corner. With respect to the structure shown in FIG. 10, oxidation of the deep trench corner is blocked by the node nitride plug in the pad oxide undercut. FIG. 10 illustrates the effectiveness of the node nitride-oxide (NO) in blocking oxidation under the pad oxide during the formation of the collar passivation oxide. Varying the amount of remaining nitride and its location allows for control of the corner oxidation process and enables a desired deep trench corner shape to be obtained.

As shown in FIG. 10, the oxidation of the deep trench corner 104 is partially blocked by the node nitride plug 102 in the pad oxide undercut region between the pad nitride 101 and the deep trench 103.

FIG. 11 shows the deep trench corner shape which results when the nitride plug is largely removed by increasing the pad oxide thickness. In this case, oxidation of the deep trench corner and a region under the pad oxide film is allowed, and the shape of the resulting deep trench edge is significantly affected.

As shown in FIG. 11, the oxidation of the deep trench corner 113 is not partially blocked by a nitride plug if the pad oxide thickness 114 is greater than twice the node nitride deposition, since the plug will be easily stripped from the pad oxide undercut region. The oxidation will grow a birds beak "A" into the pad oxide beyond the oxidation thickness "B" grown on the deep trench sidewall.

Figure 12:
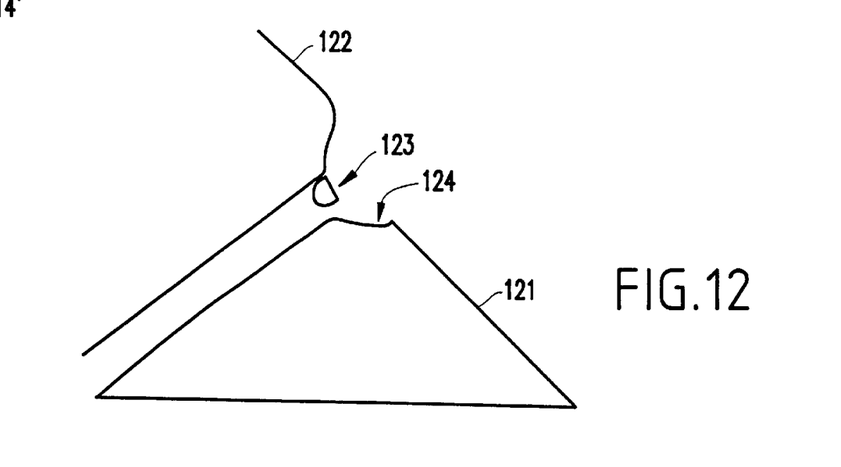
FIG. 12 is a schematic diagram of a cross-sectional view of a substrate illustrating a method of the invention.

FIG. 12 shows a similar view as in FIG. 10 for a wafer having an oxide-nitride-oxide (ONO) node dielectric. In the case of the ONO film, FIG. 12 illustrates that the oxidation of the deep trench corner has progressed through the bottom oxide layer resulting in a corner geometry which ultimately will be less abrupt than that on the wafer with the NO dielectric.

As shown in FIG. 12, the nitride plug 123 reduces the oxidation of the deep trench corner 124 by creating a narrow oxide layer under the nitride plug 123 for the subsequent oxidations to birds beak along into the pad oxide. The pad oxide is between the pad nitride 122 and the deep trench 121.

By varying the nitride remaining in the pad oxide undercut 40 (FIG. 4), the amount of silicon consumed at the trench corner by subsequent oxidation processes can be controlled. In this manner, the electric field enhancement at the trench corner is controlled and can be tuned to yield a desired corner threshold voltage value.

Figure 13:
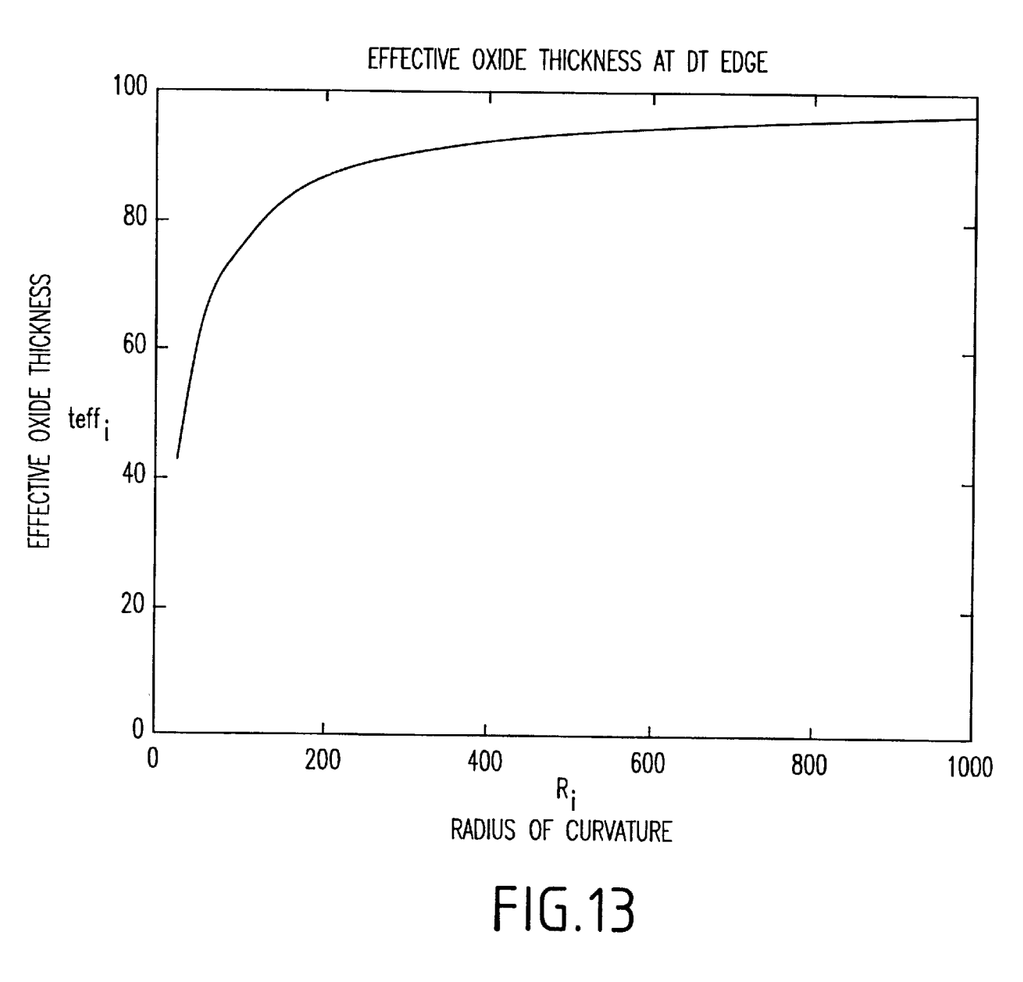
FIG. 13 is a chart showing the relationship between the effective oxide thickness and the radius of curvature.

FIG. 13 shows how the effective oxide thickness is expected to vary with the radius of curvature at the corner. Smaller angles of curvature lead to increased field enhancement and, thus, thinner effective oxides. The ultimate shape of the corner over which the gate conductor passes in a finished device is largely controlled by the amount of oxidation which has occurred at this edge during each of the thermal oxidation processes to which the device has been exposed. The ability to control the degree to which this oxidation occurs allows the degree of corner rounding and the field enhancement at the corner to be fine tuned and, therefore, the threshold voltage of the corner device to be controlled.

As noted above, the node dielectric plays an important role in controlling the shape of the deep trench corner. This effect is particularly evident when the node dielectric is an NO film, because of the effectiveness of the node nitride film as an oxidation barrier. The nitride film forms a plug within the pad oxide undercut which blocks subsequent oxidation from occurring. Control of the size and location of the nitride plug can be achieved by varying the node dielectric stripping time, the deep trench passivation strip time, the node dielectric thickness, and the pad oxide thickness.

II. Second Embodiment

A second embodiment of the invention includes changing the passivation layer stripping time to control the corner shape.

Figure 14:
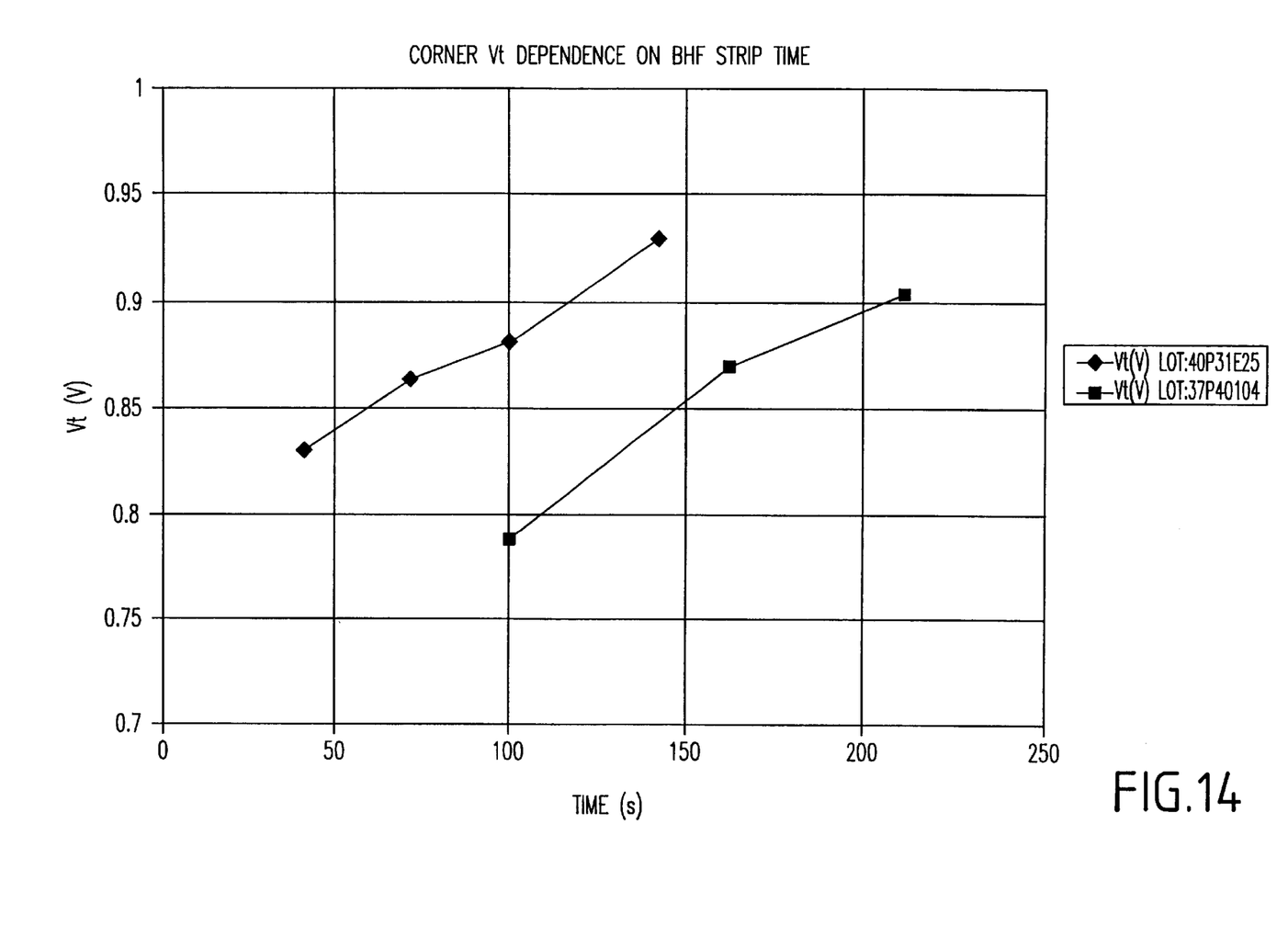
FIG. 14 is a chart showing the corner voltage threshold depending upon the passivation layer strip time.

As mentioned above, it is a characteristic of the trench etching process that the passivating film 30 (shown in FIG. 3) containing silicon dioxide and etch byproducts is formed on the sidewall of the trench structure. Processes to remove the passivation film from the deep trench after etching influence the threshold voltage of the corner device. FIG. 14 illustrates the relationship between the deep trench passivation stripping time and the deep trench bounded corner device Vt. The x-axis represents the depth of the pad oxide undercut created by the passivation strip process step. The y-axis represents the corner Vt of the deep trench bounded device. The curves are data taken from two separate experiments where the process steps were identical except the Vt implants doses were varied.

The curves in FIG. 14 show the same response for Vt as a function of pad oxide undercut time except they are shifted in the y-axis due to the Vt implant dose change. This relationship arises from the fact that the deep trench passivation strip time determines the distance of the undercut in the pad oxide.

Node dielectric films, particularly the nitride layer, which remain in the undercut after the node dielectric strip process, influence the extent to which active area silicon is oxidized under the pad stack (e.g., the bird's beak formation). Thus, by adjusting the deep trench passivation stripping time, the shape of the deep trench corner can be controlled to achieve a desired corner device threshold voltage Vt, without the need for the nitride plug 81, discussed above.

Figure 15:
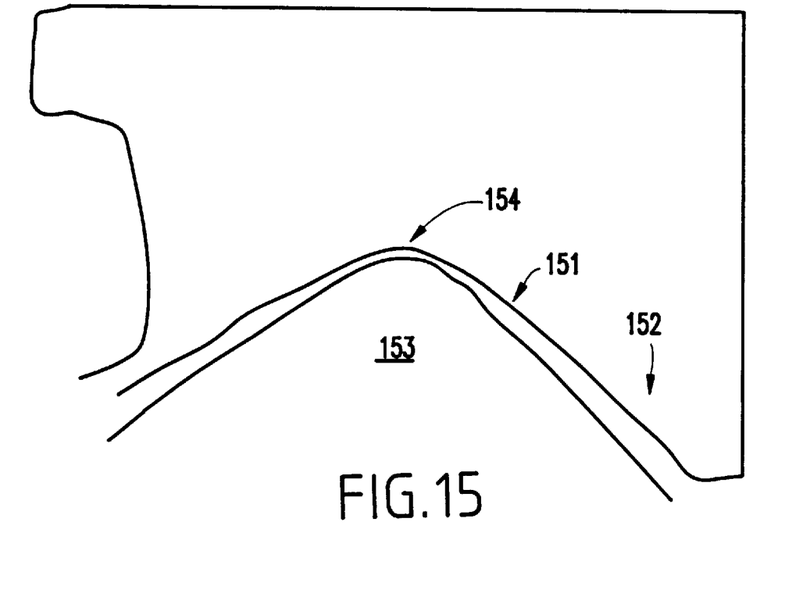
FIG. 15 is a schematic diagram of a cross-sectional view of a substrate illustrating a method of the invention.
Figure 16:
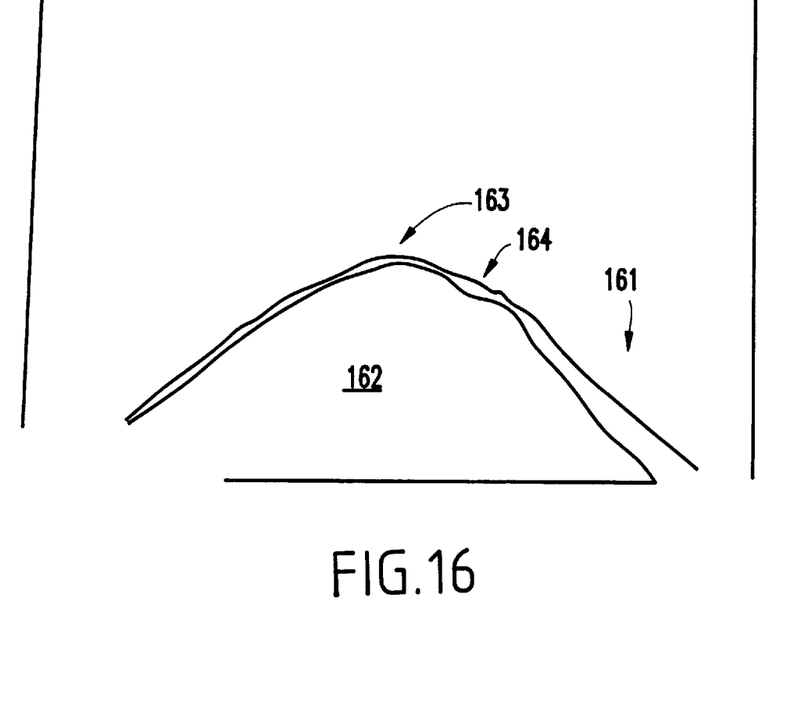
FIG. 16 is a schematic diagram of a cross-sectional view of a substrate illustrating a method of the invention.

FIGS. 15 and 16 illustrate the effect of the increased passivation stripping time on the final deep trench corner shape. In FIG. 15, item 151 is the bird's beak area, 152 is the gate conductor region, 153 is the DT bounded device and 154 is the corner. As the stripping time increases, the pad oxide undercut and the extent of the resulting bird's beak 151 increase. By controlling the extent of the bird's beak 151, the abruptness of the device corner 154 is reduced resulting in the observed increase in the corner threshold voltage Vt.

In FIG. 16, item 161 is the gate conductor region, 162 is the DT bounded device, 163 is the sharp corner and 164 is the bird's beak area. In FIG. 16, the extreme edge of the deep trench 163 is quite sharp. While such abrupt geometry leads to higher fields at the extreme edge, this region is not of sufficient area to support the current necessary to turn on the device. Thus, even though this embodiment forms abrupt geometric shapes, because the area involved is small, the inventive passivation stripping time control adjusts the shape of the deep trench corner and thereby "tunes" the corner threshold voltage Vt to a desired value.

By adjusting the etching time (and in combination with using the nitride plug, as in the first embodiment) to control the bird's beaking of subsequent oxidations, the invention is able to "micro sculpt" the corner shape to "tune" the corner device Vt.

The structure with the NO node dielectric requires less voltage to drive, for example, 10 nÅ of current through the gate oxide. Thus, as discussed above, it is critically important to control the shape of the deep trench corner to achieve increased gate oxide wearout performance.

The invention controls the deep trench passivation strip time as well as the amount and location of node dielectric remaining in the pad oxide undercut to achieve a deep trench corner geometry which provides a desired level of gate oxide wearout performance. As discussed above, sharper geometries on the deep trench edge result in higher local electric fields which, in turn, induce higher Fowler-Nordheim tunneling currents through the gate oxide. These local tunneling currents pose the greatest risk of gate oxide wearout. For this reason, control of the corner geometry is critically important.

The invention controls the shape of the trench corners by varying the stripping time of the passivation layer and by forming a nitride plug to increase the effective oxide thickness at the trench corner. By so controlling the sharpness of the trench corner and the effective oxide thickness, the invention produces a device which has a consistent threshold voltage in the channel and at the corners. Such a device will not suffer from adverse tunneling effects and will exhibit superior wear characteristics.

Thus, the invention tunes the threshold voltage Vt of the corner device independently of the channel threshold voltage Vt. Conventionally, the Vt of the corner is controlled by implants into the device, but the implant will also modify the channel Vt. Tuning of the corner device Vt by with the invention allows the sub Vt leakage of the device to be reduced without reducing the channel device current.

While the invention has been described in terms of preferred embodiments, those skilled in the art will recognize that the invention can be practiced with modification within the spirit and scope of the appended claims. For example, an additional application for this invention could be for shallow trench isolation region (STI) bounded devices. By adjusting the pad oxide undercut etching time in combination with using the nitride plug to control the bird's beaking of subsequent oxidations, the invention can "micro sculpt" the corner shape to "tune" the corner device Vt of an STI bounded device.

We claim:

1. A method of manufacturing a semiconductor trench device comprising:
   forming a dielectric on a substrate, said dielectric having an underlying oxide layer adjacent said substrate;
   etching a trench in said dielectric and said substrate;
   forming a recess in said underlying oxide layer;
   filling said recess with a nitride plug;
   filling said trench with a conductive material; and
   oxidizing said dielectric and said conductive material, wherein said nitride plug controls a shape of a trench corner of said trench.

2. The method as in claim 1, wherein said step of forming said dielectric comprises a step of forming a nitride layer and a top oxide layer, successively, on said underlying oxide layer.

3. The method as in claim 1, wherein said step of forming said dielectric comprises a step of forming a nitride layer on said underlying oxide layer.

4. The method as in claim 1, wherein said step of etching said trench allows a passivating film to remain on sidewalls of said trench, said method further comprising a step of removing said passivating film, wherein said removing step forms said recess in said underlying oxide layer.

5. The method as in claim 1, wherein said step of filling said recess with said nitride plug comprises steps of lining said trench with a nitride film and removing said nitride film from said trench, such that said nitride plug remains in said recess.

6. The method as in claim 1, wherein said step of filling said trench with said conductive material comprises steps of:
   filling a first area of said trench below said underlying oxide layer with said conductive material;
   lining a second area of said trench above said first area with a collar oxide layer; and
   filling said second area with said conductive material.

7. The method as in claim 1, further comprising, after said oxidizing step, a step of forming a gate oxide and gate conductor over said substrate and said conductive material.

8. The method as in claim 1, wherein said trench device includes a channel bounded by said trench corner, said nitride plug controlling said shape of said trench corner, such that a threshold voltage of said trench corner matches a threshold voltage of said channel.

9. The method as in claim 1, wherein said nitride plug limits oxidation of said trench corner.

10. A method of manufacturing a semiconductor trench device comprising:
    forming a dielectric, comprising an underlying oxide layer, a nitride layer and a top oxide layer, on a substrate;
    etching a trench in said dielectric and said substrate, wherein said etching step allows a passivating film to remain on sidewalls of said trench;
    removing said passivating film such that a recess is formed in said underlying oxide layer;
    lining a first area of said trench below said underlying oxide layer with a sacrificial oxide layer;
    covering said sacrificial oxide layer with a nitride film and filling said recess with said nitride film;
    filling said first area with a conductive material;
    removing said nitride film and said sacrificial oxide layer from a second area of said trench above said conductive material, such that a nitride plug remains in said recess;
    lining said second area of said trench with a collar oxide layer;
    filling said second area with said conductive material;
    oxidizing said dielectric, said collar oxide and said conductive material; and
    forming a gate oxide and gate conductor over said substrate and said conductive material, such that a channel is bounded by a trench corner of said trench,
    wherein said nitride plug controls a shape of said trench corner, such that a threshold voltage of said trench corner matches a threshold voltage of said channel.

* * * * *